United States Patent
Gao et al.

(10) Patent No.: US 9,666,833 B2
(45) Date of Patent: May 30, 2017

(54) ARRAY SUBSTRATE AND MANUFACTURING METHOD THEREOF, FLEXIBLE DISPLAY PANEL AND DISPLAY DEVICE

(71) Applicant: BOE Technology Group Co., Ltd., Beijing (CN)

(72) Inventors: Tao Gao, Beijing (CN); Weifeng Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 5 days.

(21) Appl. No.: 14/770,358

(22) PCT Filed: Feb. 9, 2015

(86) PCT No.: PCT/CN2015/072541
§ 371 (c)(1),
(2) Date: Aug. 25, 2015

(87) PCT Pub. No.: WO2016/061949
PCT Pub. Date: Apr. 28, 2016

(65) Prior Publication Data
US 2016/0351849 A1  Dec. 1, 2016

(30) Foreign Application Priority Data

Oct. 22, 2014  (CN) .......................... 2014 1 0567471

(51) Int. Cl.
*H01L 21/76* (2006.01)
*H01L 51/52* (2006.01)
(Continued)

(52) U.S. Cl.
CPC ........ *H01L 51/5253* (2013.01); *H01L 25/167* (2013.01); *H01L 27/3244* (2013.01);
(Continued)

(58) Field of Classification Search
None
See application file for complete search history.

(56) References Cited

U.S. PATENT DOCUMENTS 6,027,958 A * 2/2000 Vu .................... H01L 21/568
257/679
6,800,947 B2 * 10/2004 Sathe ................ H01L 23/49811
257/780

(Continued)

FOREIGN PATENT DOCUMENTS

CN    101251670 A    8/2008
CN    101441348 A    5/2009

(Continued)

OTHER PUBLICATIONS

Jun. 26, 2015—International Search Report Appn PCT/CN2015/072541 with Eng Tran of Written Opinion.

(Continued)

*Primary Examiner* — Michael Lebentritt
(74) *Attorney, Agent, or Firm* — Banner & Witcoff, Ltd.

(57) ABSTRACT

An array substrate and a manufacturing method thereof, a flexible display panel and a display device are provided. The array substrate includes a flexible substrate divided into a display region and a periphery region, the periphery region surrounding the display region. The array substrate further includes: an array layer and a first film layer sequentially formed in the display region on the flexible substrate; a plurality of integrate circuits and a flexible printed circuit board interface formed in the periphery region on the flexible substrate; a flexible protective film layer formed on a junction of the periphery region and the first film layer and in a region of the periphery region other than the integrate circuits and the flexible printed circuit board interface on the flexible substrate.

20 Claims, 3 Drawing Sheets

(51) Int. Cl.
*H01L 25/16* (2006.01)
*H01L 27/32* (2006.01)
*H01L 51/56* (2006.01)

(52) U.S. Cl.
CPC ........ *H01L 51/56* (2013.01); *H01L 2227/323* (2013.01); *H01L 2251/5338* (2013.01); *H01L 2251/558* (2013.01)

(56) References Cited

U.S. PATENT DOCUMENTS

| | | | | |
|---|---|---|---|---|
| 2005/0048744 | A1* | 3/2005 | Isobe | H01L 21/2022 438/486 |
| 2010/0026952 | A1* | 2/2010 | Miura | G02F 1/133305 349/150 |
| 2011/0175869 | A1 | 7/2011 | Kim et al. | |
| 2013/0063415 | A1* | 3/2013 | Shenoy | B81C 1/00238 345/418 |
| 2013/0083493 | A1* | 4/2013 | Kurihara | B23K 1/0016 361/728 |
| 2013/0248826 | A1 | 9/2013 | Kim et al. | |
| 2013/0286565 | A1* | 10/2013 | Tsuduki | H05K 5/0091 361/679.01 |
| 2014/0239276 | A1* | 8/2014 | Lin | H01L 27/3244 257/40 |
| 2016/0267836 | A1* | 9/2016 | Meersman | G09G 3/32 |
| 2016/0300853 | A1* | 10/2016 | Yamazaki | H01L 27/124 |

FOREIGN PATENT DOCUMENTS

| | | |
|---|---|---|
| CN | 103296056 A | 9/2013 |
| CN | 103700676 A | 4/2014 |
| CN | 103839900 A | 6/2014 |
| KR | 20080073060 A | 8/2008 |
| KR | 20120061486 A | 6/2012 |
| KR | 20130063580 A | 6/2013 |
| TW | 201144919 A | 12/2011 |
| WO | 2011148543 A1 | 12/2011 |

OTHER PUBLICATIONS

Sep. 20, 2016 (CN) Office action issued in CN 201410567471.0 with English translation.
Sep. 9, 2016 (KR) Office action issued in KR 10-2015-7024525 with English translation.
Feb. 28, 2017—(CN) Second Office Action Appn 201410567471.0 with English Tran.
Mar. 8, 2017 (KR) Office action issued in KR 10-2015-702425 with English translation.

* cited by examiner

ARRAY SUBSTRATE AND MANUFACTURING METHOD THEREOF, FLEXIBLE DISPLAY PANEL AND DISPLAY DEVICE

The application is a U.S. National Phase Entry of International Application No. PCT/CN2015/072541 filed on Feb. 9, 2015, designating the United States of America and claiming priority to Chinese Patent Application No. 201410567471.0 filed on Oct. 22, 2014. The present application claims priority to and the benefit of the above-identified applications and the above-identified applications are incorporated by reference herein in their entirety.

TECHNICAL FIELD

Embodiments of the present invention relate to an array substrate and a manufacturing method thereof, a flexible display panel and a display device.

BACKGROUND

Flexible display is an important development direction of display technology, and this technology, with flexible, non-friable, ultrathin and ultra light, low power consumption and portable features, has broad application prospects and good growth expectations in fields such as e-book, mobile communications, laptop, TV, and public information.

In preparation of a flexible array substrate required by a flexible display device, a flexible substrate is typically attached to a rigid carrier substrate and a display device is prepared on the flexible substrate, and finally the flexible substrate is separated from the carrier substrate by a mechanical method or a laser irradiation method. The flexible substrate can be divided into a display region and a periphery region surrounding the display region, and the periphery region of the flexible substrate is provided with Integrate Circuits (IC), a Flexible Printed Circuit Board (FPC) interface, and a circuit connecting the integrate circuits and a flexible circuit board. FIG. 1 is a schematic diagram of a flexible substrate without deformation in an ideal case, in which integrate circuits 2 and anisotropic conductive adhesive 3 for connecting the integrate circuits 2 and the flexible substrate 1 are formed on the flexible substrate 1. FIG. 2 is a schematic diagram of the flexible substrate having stress deformation after peeled from the carrier substrate, in which connection points of the integrate circuits 2 and the flexible substrate 1 cracked and part of the anisotropic conductive adhesive 3 is failed. Reasons for failure as illustrated in FIG. 2 include: the number of film layers in the periphery region is much less than those in the display region, and the integrate circuits or a variety of circuits made of rigid materials affect stress distribution. Therefore, when the flexible substrate are peeled from the carrier substrate, the flexible substrate instantaneously releases stress, which is not uniform and thus is likely to cause line break of the periphery region and reduce a product yield.

SUMMARY OF THE INVENTION

According to an embodiment of the invention, an array substrate is provided. The array substrate comprises a flexible substrate divided into a display region and a periphery region, the periphery region surrounding the display region. The array substrate further comprises: an array layer and a first film layer sequentially formed in the display region on the flexible substrate; a plurality of integrate circuits and a flexible printed circuit board interface formed in the periphery region on the flexible substrate; a flexible protective film layer formed at a junction of the periphery region and the first film layer and in a region of the periphery region other than the integrate circuits and the flexible printed circuit board interface on the flexible substrate.

For example, the material of the flexible protective film layer is epoxy resin adhesive, silicone adhesive or UV-curable adhesive.

For example, a viscosity range of the flexible protective film layer is 40-50 Pa·s; a shear strength of the flexible protective film layer after curing is 25-35 MPa; and a peeling strength of the flexible protective film layer after curing is 9-12 KN/m.

For example, a thickness of the flexible protective film layer is 5-15 micrometers.

For example, the first film layer is a barrier film layer, and the barrier film layer is one of a polyethylene naphthalate film doped with SiNx or SiO, a polyethylene terephthalate film or a polyimide film or a composite film layer of combination thereof.

For example, the array substrate further comprises: an organic electroluminescence film layer disposed between the array layer and the barrier film layer.

For example, the first film layer is an electronic ink display film layer.

According to an embodiment of the invention, a flexible display panel is provided. The flexible display panel comprises the array substrate described above.

According to an embodiment of the invention, a display device is provided. The display device comprises the display panel described above.

According to an embodiment of the invention, a manufacturing method of an array substrate is provided. The manufacturing method comprises: providing a flexible substrate the flexible substrate being divided into a display region and a periphery region, the periphery region surrounding the display region; forming an array layer and a first film layer sequentially in the display region on the flexible substrate; forming a plurality of integrate circuits and a flexible printed circuit board interface in the periphery region on the flexible substrate; forming a flexible protective film layer at a junction of the periphery region and a packaging barrier film and in a region of the periphery region other than the integrate circuits and the flexible printed circuit board interface on the flexible substrate.

For example, forming the flexible protective film layer at the junction of the periphery region and the packaging barrier film and in the region of the periphery region other than the integrate circuits and the flexible printed circuit board interface on the flexible substrate, includes: applying epoxy resin adhesive material or silicone adhesive material at the junction of the periphery region and the packaging barrier film and in the region of the periphery region other than the integrate circuits and the flexible printed circuit board interface on the flexible substrate, and forming the flexible protective film layer by curing at room temperature; or, applying UV-curable adhesive material at the junction of the periphery region and the packaging barrier film and in a region of the periphery region other than the integrate circuits and the flexible printed circuit board interface on the flexible substrate, and forming the flexible protective film layer by UV curing.

For example, a viscosity range of the flexible protective film layer is 40-50 Pa·s; a shear strength of the flexible protective film layer after curing is 25-35 MPa; and a peeling strength of the flexible protective film layer after curing is 9-12 KN/m.

For example, a thickness of the flexible protective film layer is 5-15 micrometers.

For example, the first film layer is a barrier film layer, and the barrier film layer is one of a polyethylene naphthalate film doped with SiNx or SiO, a polyethylene terephthalate film or a polyimide film or a composite film layer of combination thereof.

For example, the manufacturing method further comprises: forming an organic electroluminescence film layer between the array layer and the barrier film layer.

For example, the first film layer is an electronic ink display film layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

Figure 1:
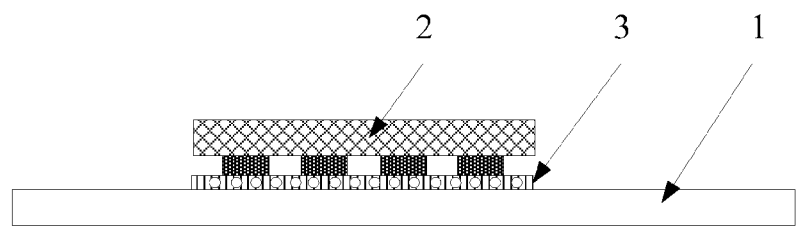
FIG. 1 is a schematic diagram of a flexible substrate without deformation in an ideal case.
Figure 2:
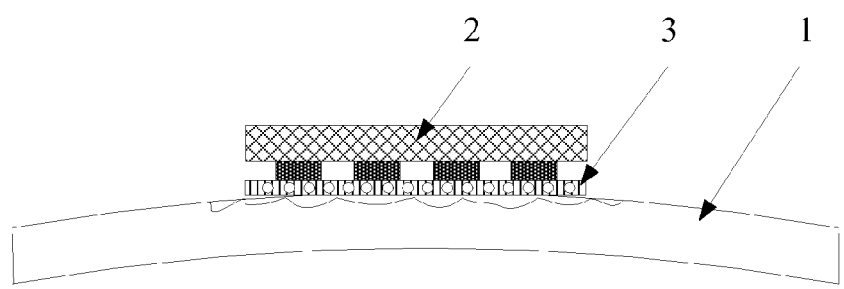
FIG. 2 is a schematic diagram of the flexible substrate having stress deformation after peeled from the carrier substrate.
Figure 3:
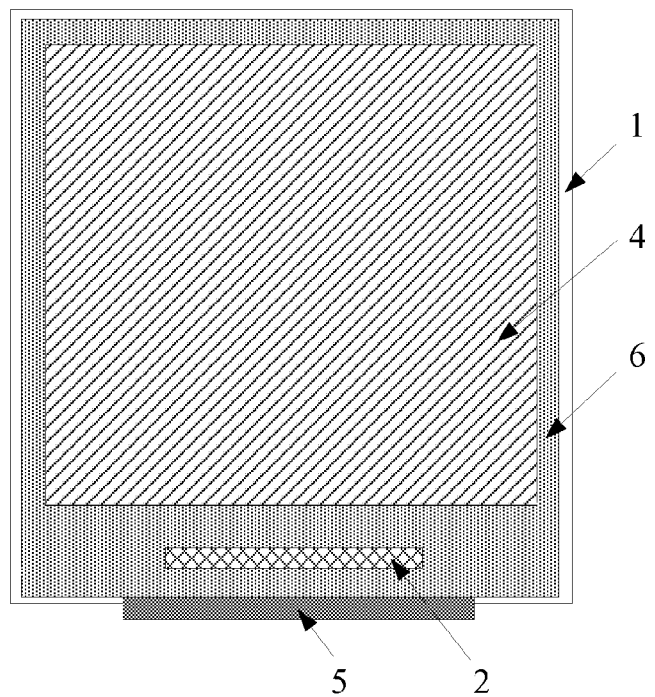
FIG. 3 is a top view of an array substrate provided by an embodiment of the present invention.
Figure 4:
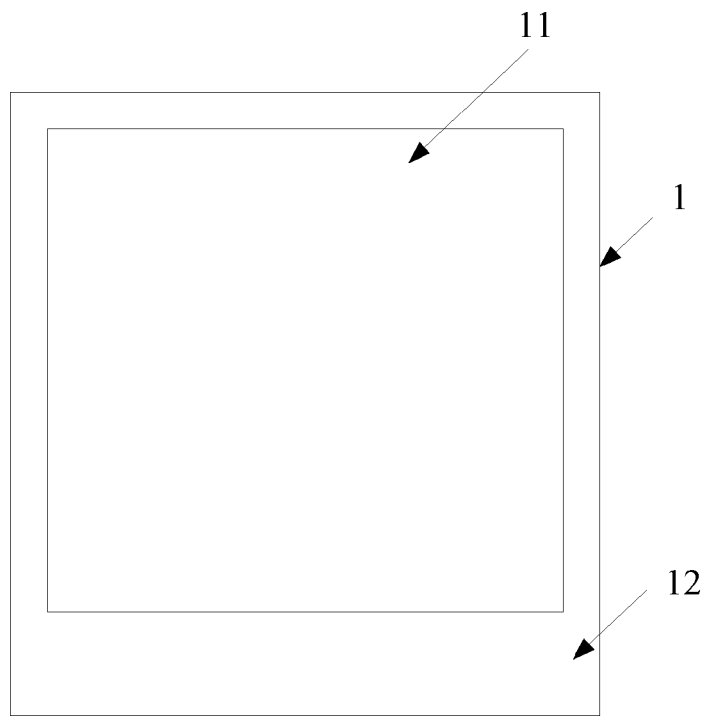
FIG. 4 is a schematic diagram of a flexible substrate comprising a display region and a periphery region.

Referring to FIG. 3 and FIG. 4, the embodiment of the invention provides an array substrate, comprising a flexible substrate 1 divided into a display region 11 and a periphery region 12, the periphery region 12 surrounding the display region 11. The array substrate further comprises: an array layer (not illustrated) and a first film layer 4 sequentially formed in the display region 11 on the flexible substrate 1; a plurality of integrate circuits 2 and a flexible printed circuit board interface 5 formed in the periphery region 12 on the flexible substrate 1; a flexible protective film layer 6 formed at a junction of the periphery region 12 and the first film layer 4 and in a region of the periphery region 12 other than the integrate circuits 2 and the flexible printed circuit board interface 5 on the flexible substrate 1. For example, the first film layer 4 is located in the whole display region 11.

Figure 6:
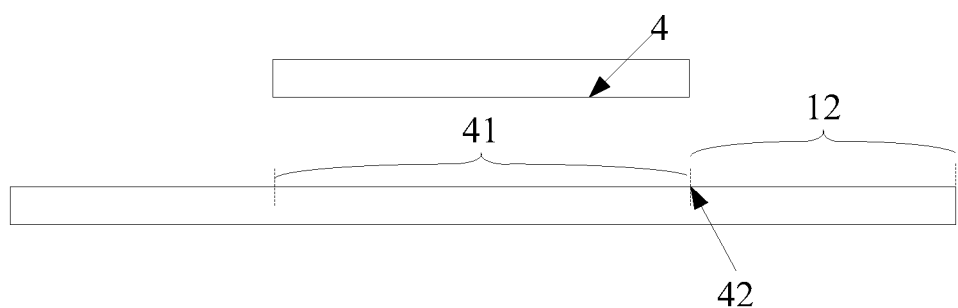
FIG. 6 is a schematic diagram of a junction of the periphery region and a first film layer provided by an embodiment of the present invention.

As illustrated in FIG. 6, it should be noted that the junction refers to a border line 42 between an orthogonal projection 41 of the first film layer 4 on the flexible substrate 1 and the periphery region 12. Since the first film layer 4 and the array layer below it are very thin, it can be deemed that the first film layer 4 and the periphery region 12 are in a same plane, and the border line 42 can be deemed as a border line of an edge of the first film layer 4 in contact with the periphery region 12. Besides, the border line 42 can also be deemed as a sum of the border line of the edge of the first film layer 4 in contact with the periphery region 12 as well as side surfaces above the edge of the first film layer 4. Therefore, the flexible protective film layer 6 covers the border line 42, which can make a close connection between the first film layer 4 and the periphery region 12 and close an edge gap between the first film layer 4 and respective lower portions thereunder to avoid internal oxidation and corrosion.

On the flexible substrate 1 of the display region 11, depending on different types of display panels to which the array substrate is applied, there may be different elements or film layers, which typically both include the array layer described above. As the display region 11 has a multi-layer structure, the display region 11 has higher strength as compared with the periphery region 12. Except the rigid integrate circuits 2, the flexible printed circuit board interface 5, and the metal wires, there is typically no other film layers provided in the periphery region 12, and thus there is a great strength difference between the flexible substrate 1 of the periphery region 12 and the flexible substrate 1 of the display region 11. In the present embodiment, by forming the flexible protective film layer 6 at the junction of the periphery region 12 and the first film layer 4 and in a region of the periphery region 12 other than the integrate circuits and the flexible printed circuit board interface on the flexible substrate 1, the flexible protective film layer 6 (mainly in the periphery region 12) and the flexible substrate 1 combined therewith form a composite layered structure, which enhances the strength of the flexible substrate 1 of the periphery region 12.

For example, the material of the flexible protective film layer 6 is epoxy resin adhesive, silicone adhesive or UV-curable adhesive.

In order to ensure that the flexible substrate 1 provided with the flexible protective film layer 6 has enough strength and has uniform force when separated from the carrier substrate, for example, the flexible protective film layer 6 is required as follows: a viscosity range of the flexible protective film layer 6 is 40-50 Pa·s; a shear strength of the flexible protective film layer 6 after curing is 25-35 MPa; and a peeling strength of the flexible protective film layer 6 after curing is 9-12 KN/m.

For example, a thickness of the flexible protective film layer 6 is 5-15 micrometers.

For example, the first film layer 4 is a barrier film layer, and the barrier film layer is one of a Polyethylene Naphthalate (PEN) film doped with SiNx or SiO, a Polyethylene Terephthalate (PET) film or a Polyimide (PI) film or a composite film layer of combination thereof.

If the array substrate is used in OLED display penal, the array substrate further comprises an organic light-emitting OLED film layer (not illustrated) disposed between the array layer (not illustrated) and the first film layer 4.

If the array substrate is used in an electrophoresis display panel, the first film layer 4 is an electronic ink display film layer.

Advantageous effects of the embodiment of the present invention are as follows: the flexible protective film layer is formed at the junction of the periphery region and the first film layer and in a region of the periphery region other than the integrate circuits and the flexible printed circuit board interface on the flexible substrate, enhancing the strength of the flexible substrate of the periphery region; and the flexible substrate has uniform force when separated from the substrate, avoiding the line break in the periphery region, thereby improving the product yield.

Embodiment 2

The embodiment of the present invention provides a flexible display panel, comprising the array substrate provided by the embodiment above.

Advantageous effects of the embodiment of the present invention are as follows: the flexible protective film layer is formed at the junction of the periphery region and the first film layer and in a region of the periphery region other than the integrate circuits and the flexible printed circuit board interface on the flexible substrate, enhancing the strength of the flexible substrate of the periphery region; and the flexible substrate has uniform force when separated from the substrate, avoiding the line break in the periphery region, thereby improving the product yield.

Embodiment 3

The embodiment of the present invention provides a display device, comprising the flexible display panel provided by the embodiment above.

Advantageous effects of the embodiment of the present invention are as follows: the flexible protective film layer is formed at the junction of the periphery region and the first film layer and in a region of the periphery region other than the integrate circuits and the flexible printed circuit board interface on the flexible substrate, enhancing the strength of the flexible substrate of the periphery region; and the flexible substrate has uniform force when separated from the substrate, avoiding the line break in the periphery region, thereby improving the product yield.

Embodiment 4

Figure 5:
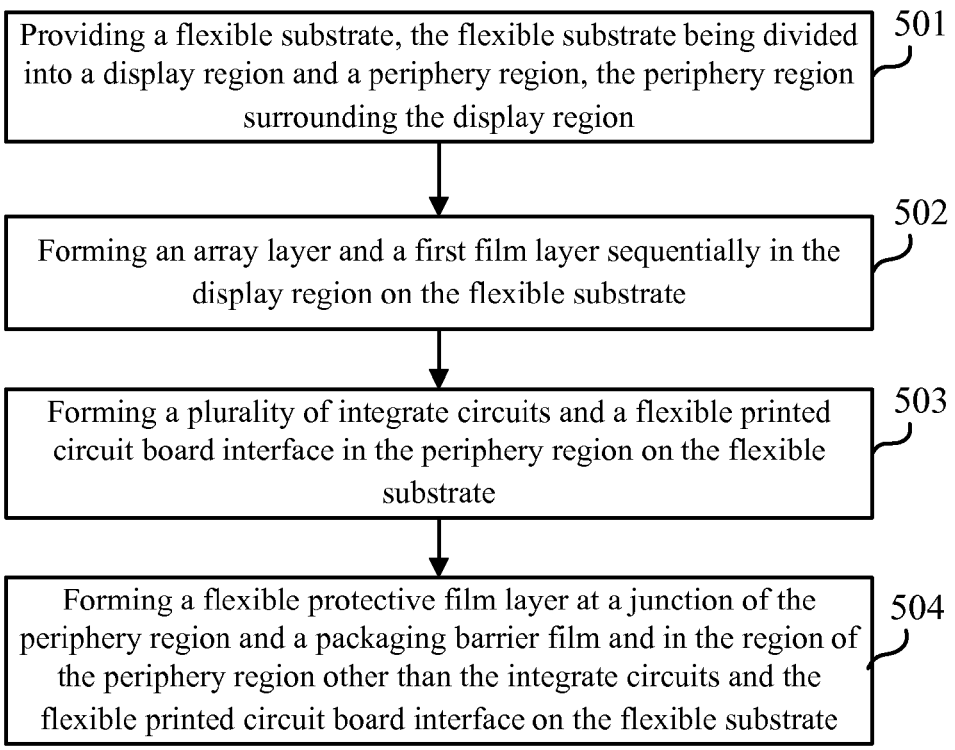
FIG. 5 is a flow chart illustrating a manufacturing method of an array substrate provided by an embodiment of the present invention.

Referring to FIG. 5, the embodiment of the present invention provides a manufacturing method of an array substrate, comprising:

501: providing a flexible substrate, the flexible substrate being divided into a display region and a periphery region, the periphery region surrounding the display region.

502: forming an array layer and a first film layer sequentially in the display region on the flexible substrate.

503: forming a plurality of integrate circuits and a flexible printed circuit board interface on the flexible substrate of the periphery region.

504: forming a flexible protective film layer at a junction of the periphery region and a packaging barrier film and in a region of the periphery region other than the integrate circuits and the flexible printed circuit board interface on the flexible substrate.

In the present embodiment, step 504 includes: applying 5-15 micrometers of epoxy resin adhesive material or silicone adhesive material at the junction of the periphery region and the packaging barrier film and in a region of the periphery region other than the integrate circuits and the flexible printed circuit board interface on the flexible substrate, and forming the flexible protective film layer by curing for 60 minutes at room temperature; or, applying 5-15 micrometers of UV-curable adhesive material at the junction of the periphery region and the packaging barrier film and in a region of the periphery region other than the integrate circuits and the flexible printed circuit board interface on the flexible substrate, and forming the flexible protective film layer by ultraviolet (UV) curing.

Of course, for the array substrate to be applied to different display panels, different elements or film layers need to be prepared. For example, for an OLED display panel, while forming the array layer and the first film layer sequentially on the flexible substrate of the display region, its fabrication method further comprises: forming an OLED film layer between the array layer and the first film layer, wherein the OLED film layer may be formed by evaporating OLED material and the first film layer is a barrier film layer to prevent permeation of the water and the oxygen. For example, the barrier film layer is one of a Polyethylene Naphthalate (PEN) film doped with SiNx or SiO, a Polyethylene Terephthalate (PET) film and a Polyimide (PI) film or a composite film layer of combination thereof, which will not be repeated here.

For another example, for an electrophoresis display panel, the first film layer is an electronic ink display film layer. The electronic ink display film layer can be prepared by an attaching method.

Of course, in the present embodiment, after step 504, a step of peeling the flexible substrate from the carrier substrate is further included. The back of the flexible substrate can be irradiated by laser to make the flexible substrate separated from the rigid carrier substrate.

Advantageous effects of the embodiment of the present invention are as follows: the flexible protective film layer is formed at the junction of the periphery region and the first film layer and in a region of the periphery region other than the integrate circuits and the flexible printed circuit board interface on the flexible substrate, enhancing the strength of the flexible substrate of the periphery region; and the flexible substrate has uniform force when separated from the carrier substrate, avoiding the line break in the periphery region, thereby improving the product yield.

The foregoing embodiments merely are exemplary embodiments of the invention, and not intended to define the scope of the invention, and the scope of the invention is determined by the appended claims.

The present application claims priority of Chinese Patent Application No. 201410567471.0 filed on Oct. 22, 2014, the disclosure of which is incorporated herein by reference in its entirety as part of the present application.

What is claimed is:

1. An array substrate, comprising a flexible substrate divided into a display region and a periphery region, the periphery region surrounding the display region;
    wherein, the array substrate further comprises:
        an array layer and a first film layer sequentially formed in the display region on the flexible substrate;
        a plurality of integrate circuits and a flexible printed circuit board interface formed in the periphery region on the flexible substrate; and
        a flexible protective film layer formed at a junction of the periphery region and the first film layer and in a region of the periphery region other than the integrate circuits and the flexible printed circuit board interface on the flexible substrate.

2. The array substrate according to claim 1, wherein the flexible protective film layer has a material of epoxy resin adhesive, silicone adhesive or UV-curable adhesive.

3. The array substrate according to claim 2, wherein a viscosity range of the flexible protective film layer is 40-50 Pa·s; a shear strength of the flexible protective film layer after curing is 25-35 MPa; and a peeling strength of the flexible protective film layer after curing is 9-12 KN/m.

4. The array substrate according to claim 2, wherein a thickness of the flexible protective film layer is 5-15 micrometers.

5. The array substrate according to claim 1, wherein the first film layer is a barrier film layer, and the barrier film layer is one of a polyethylene naphthalate film doped with SiNx or SiO, a polyethylene terephthalate film or a polyimide film or a composite film layer of combination thereof.

6. The array substrate according to claim 5, further comprising: an organic electroluminescence film layer disposed between the array layer and the barrier film layer.

7. The array substrate according to claim 1, wherein the first film layer is an electronic ink display film layer.

8. A flexible display panel, comprising the array substrate according to claim 1.

9. A display device, comprising the flexible display panel according to claim 8.

10. A manufacturing method of an array substrate, comprising:
providing a flexible substrate, the flexible substrate being divided into a display region and a periphery region, the periphery region surrounding the display region;
forming an array layer and a first film layer sequentially in the display region on the flexible substrate;
forming a plurality of integrate circuits and a flexible printed circuit board interface in the periphery region on the flexible substrate;
forming a flexible protective film layer at a junction of the periphery region and the first film layer and in a region of the periphery region other than the integrate circuits and the flexible printed circuit board interface on the flexible substrate.

11. The manufacturing method according to claim 10, wherein forming the flexible protective film layer at the junction of the periphery region and the first film layer and in the region of the periphery region other than the integrate circuits and the flexible printed circuit board interface on the flexible substrate, includes:
applying epoxy resin adhesive material or silicone adhesive material at the junction of the periphery region and the first film layer and in the region of the periphery region other than the integrate circuits and the flexible printed circuit board interface on the flexible substrate, and forming the flexible protective film layer by curing at room temperature; or,
applying UV-curable adhesive material at the junction of the periphery region and the first film layer and in a region of the periphery region other than the integrate circuits and the flexible printed circuit board interface on the flexible substrate, and forming the flexible protective film layer by UV curing.

12. The manufacturing method according to claim 11, wherein a viscosity range of the flexible protective film layer is 40-50 Pa·s; a shear strength of the flexible protective film layer after curing is 25-35 MPa; and a peeling strength of the flexible protective film layer after curing is 9-12 KN/m.

13. The manufacturing method according to claim 11, wherein a thickness of the flexible protective film layer is 5-15 micrometers.

14. The manufacturing method according to claim 10, wherein the first film layer is a barrier film layer, and the barrier film layer is one of a polyethylene naphthalate film doped with SiNx or SiO, a polyethylene terephthalate film or a polyimide film or a composite film layer of combination thereof.

15. The manufacturing method according to claim 14, further comprising: forming an organic electroluminescence film layer between the array layer and the barrier film layer.

16. The manufacturing method according to claim 10, wherein the first film layer is an electronic ink display film layer.

17. The flexible display panel according to claim 8, wherein the flexible protective film layer has a material of epoxy resin adhesive, silicone adhesive or UV-curable adhesive.

18. The flexible display panel according to claim 17, wherein a viscosity range of the flexible protective film layer is 40-50 Pa·s; a shear strength of the flexible protective film layer after curing is 25-35 MPa; and a peeling strength of the flexible protective film layer after curing is 9-12 KN/m.

19. The flexible display panel according to claim 17, wherein a thickness of the flexible protective film layer is 5-15 micrometers.

20. The flexible display panel according to claim 8, wherein the first film layer is a barrier film layer, and the barrier film layer is one of a polyethylene naphthalate film doped with SiNx or SiO, a polyethylene terephthalate film or a polyimide film or a composite film layer of combination thereof.

* * * * *